(12) United States Patent
Chen

(10) Patent No.: US 8,716,099 B2
(45) Date of Patent: May 6, 2014

(54) PHASE-CHANGE MEMORY

(71) Applicant: Higgs Opl. Capital LLC, Dover, DE (US)

(72) Inventor: Frederick T. Chen, Hsinchu (TW)

(73) Assignee: Higgs Opl. Capital LLC, Dover, DE (US)

( * ) Notice: Subject to any disclaimer, the term of this patent is extended or adjusted under 35 U.S.C. 154(b) by 0 days.

(21) Appl. No.: 13/796,680

(22) Filed: Mar. 12, 2013

(65) Prior Publication Data

US 2013/0196467 A1 Aug. 1, 2013

Related U.S. Application Data

(60) Division of application No. 12/324,871, filed on Nov. 27, 2008, now Pat. No. 8,426,838, which is a continuation-in-part of application No. 12/020,489, filed on Jan. 25, 2008, now abandoned.

(51) Int. Cl.
*H01L 21/20* (2006.01)

(52) U.S. Cl.
USPC ................ 438/382; 438/197; 257/4; 257/295

(58) Field of Classification Search
USPC ....................... 438/382; 257/4, 295
See application file for complete search history.

(56) References Cited

U.S. PATENT DOCUMENTS

| | | | |
|---|---|---|---|
| 6,613,604 B2 | 9/2003 | Maimon et al. | |
| 6,815,266 B2 | 11/2004 | Rodgers et al. | |
| 6,815,705 B2 | 11/2004 | Klersy et al. | |
| 6,867,425 B2 | 3/2005 | Wicker | |
| 6,972,428 B2 | 12/2005 | Maimon | |
| 7,023,014 B2 | 4/2006 | Morimoto et al. | |
| 7,092,286 B2 | 8/2006 | Lowery et al. | |

(Continued)

FOREIGN PATENT DOCUMENTS

| | | |
|---|---|---|
| CN | 1819297 | 8/2006 |
| CN | 1879234 | 12/2006 |

(Continued)

OTHER PUBLICATIONS

China Patent Office, Office Action, Patent Application Serial No. 200910134896.1, Sep. 28, 2011, China.

(Continued)

*Primary Examiner* — Thao Le
*Assistant Examiner* — Geoffrey Ida
(74) *Attorney, Agent, or Firm* — Stolowitz Ford Cowger LLP

(57) ABSTRACT

A phase-change memory element with side-wall contacts is disclosed, which has a bottom electrode. A non-metallic layer is formed on the electrode, exposing the periphery of the top surface of the electrode. A first electrical contact is on the non-metallic layer to connect the electrode. A dielectric layer is on and covering the first electrical contact. A second electrical contact is on the dielectric layer. An opening is to pass through the second electrical contact, the dielectric layer, and the first electrical contact and preferably separated from the electrode by the non-metallic layer. A phase-change material is to occupy one portion of the opening, wherein the first and second electrical contacts interface the phase-change material at the side-walls of the phase-change material. A second non-metallic layer may be formed on the second electrical contact. A top electrode contacts the top surface of the outstanding terminal of the second electrical contact.

20 Claims, 8 Drawing Sheets

(56) References Cited

U.S. PATENT DOCUMENTS

| | | | |
|---|---|---|---|
| 7,119,353 | B2 | 10/2006 | Lankhorst et al. |
| 7,138,687 | B2 | 11/2006 | Lung et al. |
| 7,173,271 | B2 | 2/2007 | Chang |
| 7,183,567 | B2 | 2/2007 | Chiang |
| 7,214,958 | B2 | 5/2007 | Happ |
| 7,227,170 | B2 | 6/2007 | Ovshinsky |
| 7,227,221 | B2 | 6/2007 | Ovshinsky |
| 7,352,037 | B2 | 4/2008 | Kim et al. |
| 7,417,245 | B2 | 8/2008 | Happ et al. |
| 7,419,881 | B2 | 9/2008 | Cho et al. |
| 7,476,587 | B2 | 1/2009 | Lung |
| 7,488,967 | B2 | 2/2009 | Burr et al. |
| 7,504,652 | B2 | 3/2009 | Huang |
| 7,521,372 | B2 | 4/2009 | Chen |
| 7,521,706 | B2 | 4/2009 | Jeong et al. |
| 7,529,123 | B2 | 5/2009 | Ovshinsky et al. |
| 7,547,906 | B2 | 6/2009 | Ovshinsky |
| 7,566,895 | B2 | 7/2009 | Chen |
| 7,608,503 | B2 | 10/2009 | Lung |
| 7,626,191 | B2 | 12/2009 | Chao et al. |
| 7,670,869 | B2 | 3/2010 | Yu |
| 7,678,606 | B2 | 3/2010 | Chen |
| 7,679,163 | B2 | 3/2010 | Chen et al. |
| 7,745,811 | B2 | 6/2010 | Lee |
| 7,772,582 | B2 | 8/2010 | Chen et al. |
| 7,800,092 | B2 | 9/2010 | Liu et al. |
| 7,852,658 | B2 | 12/2010 | Liu et al. |
| 7,858,961 | B2 | 12/2010 | Chuang et al. |
| 7,897,952 | B2 | 3/2011 | Wouters et al. |
| 7,910,905 | B2 | 3/2011 | Liu |
| 7,919,768 | B2 | 4/2011 | Chen |
| 7,923,714 | B2 | 4/2011 | Hsu |
| 7,964,862 | B2 | 6/2011 | Chen et al. |
| 2003/0062595 | A1 | 4/2003 | Anthony |
| 2006/0108667 | A1 | 5/2006 | Lung |
| 2006/0110878 | A1 | 5/2006 | Lung et al. |
| 2006/0110888 | A1 * | 5/2006 | Cho et al. ............ 438/385 |
| 2006/0175599 | A1 | 8/2006 | Happ |
| 2006/0284157 | A1 | 12/2006 | Chen |
| 2006/0284158 | A1 | 12/2006 | Lung |
| 2006/0284159 | A1 | 12/2006 | Chang et al. |
| 2007/0012905 | A1 | 1/2007 | Huang |
| 2007/0272950 | A1 | 11/2007 | Kim et al. |
| 2007/0278529 | A1 | 12/2007 | Lai |
| 2007/0281420 | A1 | 12/2007 | Lai |
| 2008/0081473 | A1 | 4/2008 | Suzuki |
| 2008/0138929 | A1 | 6/2008 | Lung |
| 2008/0138930 | A1 | 6/2008 | Lung |
| 2008/0272355 | A1 | 11/2008 | Cho et al. |
| 2008/0303014 | A1 | 12/2008 | Goux et al. |
| 2008/0308782 | A1 | 12/2008 | Shue et al. |
| 2009/0098716 | A1 | 4/2009 | Lung |
| 2009/0104771 | A1 | 4/2009 | Lung |
| 2009/0189140 | A1 | 7/2009 | Chen |
| 2009/0189142 | A1 | 7/2009 | Chen |
| 2010/0117050 | A1 | 5/2010 | Chen et al. |
| 2010/0148141 | A1 | 6/2010 | Lee et al. |

FOREIGN PATENT DOCUMENTS

| | | |
|---|---|---|
| CN | 101211959 | 4/2010 |
| CN | 101740716 | 6/2010 |
| CN | 101626060 | 12/2010 |
| CN | 101308903 | 6/2011 |
| CN | 101383397 | 12/2011 |
| CN | 101504968 | 12/2011 |
| JP | 2002246561 | 8/2002 |
| JP | 2004274055 | 9/2004 |
| JP | 2005525690 | 8/2005 |
| JP | 2006510220 | 3/2006 |
| JP | 2006108645 | 4/2006 |
| JP | 2006295168 | 10/2006 |
| JP | 2007103945 | 4/2007 |
| JP | 2007509489 | 4/2007 |
| JP | 2008085204 | 4/2007 |
| JP | 2007184591 | 7/2007 |
| JP | 2007243169 | 9/2007 |
| JP | 2008078625 | 4/2008 |
| JP | 2008091870 | 4/2008 |
| JP | 2008530790 | 8/2008 |
| JP | 2008283163 | 11/2008 |
| TW | 200828506 | 7/2008 |
| TW | 200845443 | 11/2008 |
| TW | 200913252 | 6/2009 |
| TW | 200937693 | 9/2009 |
| TW | 201003851 | 5/2010 |
| TW | 201019467 | 5/2010 |
| WO | 2006084856 | 8/2006 |

OTHER PUBLICATIONS

Office Action, China Patent Office, Serial No. 200910009855.X, Dec. 1, 2010.

J.H. Yi et al., "Novel Cell Structure of PRAM With Thin Metal Layer Inserted GeSbTe", IEEE, IEDM '03 Technical Digest, 2003, p. 901-904.

Stolowitz Ford Cowger LLP, "Listing of Related Cases", Mar. 12, 2013, 1 page.

* cited by examiner

PHASE-CHANGE MEMORY

CROSS-REFERENCE TO RELATED APPLICATIONS

This application is a divisional of U.S. patent application Ser. No. 12/324,871, filed Nov. 27, 2008, now U.S. Pat. No. 8,426,838, issued Apr. 23, 2013, which is a continuation-in-part of U.S. patent application Ser. No. 12/020,489, filed Jan. 25, 2008, now abandoned, the disclosures of which are herein incorporated by reference in their entirety.

BACKGROUND OF THE INVENTION

1. Field of the Invention

The invention relates to a memory, and more particularly to a phase-change memory and method for fabricating the same.

2. Description of the Related Art

Phase-change memory technology requires high reliability, fast speeds, low current, and low operating voltage, in order to function as a viable alternative to current memory technologies such as flash and DRAM. A phase-change memory cell must therefore provide low programming current, low operating voltage, a smaller cell size, a fast phase transformation speed, and a low cost. These requirements are difficult to meet given the current state of the art.

Current phase-change memory technology makes use of heating at the interface between a metal electrode contact and the phase-change material. More effective heating requires a smaller contact area, or equivalently a smaller heating area. A benefit of this strategy is simultaneous reduction of cell size. However, reducing the current-carrying area results in higher cell resistance, which increases the required driving voltage. This is clearly not desirable. Reducing heating area does not necessarily improve other performance features. There is a large temperature gradient that exists between the contact and the bulk of the phase-change material. Phase transformation speed requires good thermal uniformity within the active region of the cell. The rate of phase-change is extremely sensitive to temperature. Non-uniform heating results in a loss of reliability due to accumulation of incomplete phase-change in the programming volume.

United States Patent 20070012905 utilizes a single edge contact to the lower electrode, while the upper electrode uses a conventional planar contact. In addition, U.S. Pat. No. 6,881,603 also minimizes only the lower electrode contact area while the upper electrode contact is planar. Meanwhile, U.S. Pat. No. 6,864,503 makes use of a phase-change material spacer with top and bottom edge contacts, however, the heating area is proportional to the electrode radius, so it is relatively large, and the upper and lower electrodes are effective heat sinks.

Therefore, it is desirable to devise a phase-change memory cell structure that improves thermal uniformity as well as heating efficiency while allowing for a smaller heating area.

BRIEF SUMMARY OF THE INVENTION

An exemplary embodiment a phase-change memory includes a bottom electrode. A first non-metallic layer is preferably formed on the bottom electrode, exposing the periphery of the top surface of the bottom electrode. A first electrical contact is formed on the first non-metal layer and electrically connected to the bottom electrode. A first dielectric layer is formed on and covering the first electrical contact. A second electrical contact formed on the first dielectric layer, wherein the second electrical contact includes an outstanding terminal. A second non-metallic layer is then preferably formed over the second electrical contact. An opening is formed to pass through the second electrical contact, the first dielectric layer, and the first electrical contact and landing on the bottom electrode, or separated from the bottom electrode by the first non-metallic layer. A phase-change material is formed to occupy at least one portion of the opening, wherein the first and second electrical contacts interface the phase-change material at the side-walls of the phase-change material. A second dielectric layer is formed on and covering the second electrical contact and exposing a top surface of the outstanding terminal. A top electrode is formed in the second dielectric layer and directly contacting the top surface of the outstanding terminal of the second electrical contact.

According to another embodiment of the invention, a method for fabricating a phase-change memory is provided, including the following steps: providing a bottom electrode; forming a first non-metallic layer on the bottom electrode, exposing the periphery of the top surface of the bottom electrode; forming a first electrical contact on the first non-metallic layer electrically connected to the bottom electrode; forming a first dielectric layer covering the first electrical contact; forming an etch stop layer over the first dielectric layer; forming a second dielectric layer over the etch stop layer; forming a second electrical contact in a trench in the second dielectric layer; forming a third dielectric layer on the second electrical contact; planarizing the third dielectric layer and the second electrical contact to expose a top surface of an outstanding terminal of the second electrical contact; fouling an opening passing through the third dielectric layer, second electrical contact, the first dielectric layer, and the first electrical contact and separated from the bottom electrode by the first non-metallic layer; filling a phase-change material into a part of the opening, forcing the first and second electrical contacts to interface the phase-change material at the side-walls of the phase-change material; filling a fourth dielectric layer into the opening, covering the third dielectric layer and the outstanding terminal; and forming a top electrode in the fourth dielectric directly contacting the top surface of the outstanding terminal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
FIGS. 1a-1o are cross sections of a method for fabricating a phase-change memory according to an embodiment of the invention.

First, referring to FIG. 1a, a substrate 10 with a bottom electrode 12 formed thereon is provided. Particularly, the substrate 10 can be a substrate employed in a semiconductor process, such as silicon substrate. The substrate 10 can be a substrate including a complementary metal oxide semiconductor (CMOS) circuit, isolation structure, diode, or capacitor. The accompanying drawings show the substrate 10 in a plain rectangle in order to simplify the illustration. Suitable material for the bottom electrode 12, for example, is Al, W, Mo, Ti, TiN, TiAlN, TiW or TaN.

Figure 1B:
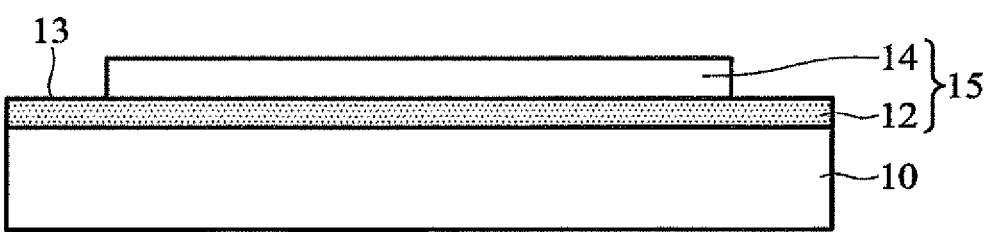
Figure 1C:
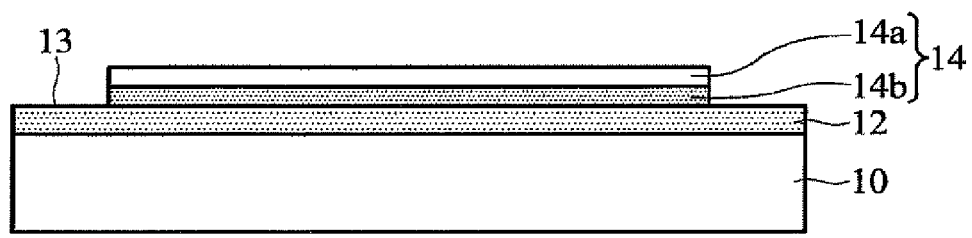

Next, referring to FIG. 1b, a non-metallic layer 14 is formed on the bottom electrode 12 to expose the surrounding top surface 13 of the bottom electrode 12, wherein the bottom electrode 12 and the layer 14 formed on the bottom electrode 12 create a ladder-like configuration 15. The layer 14 can be a silicon-containing compound, such as silicon nitride or silicon oxide. In another embodiment of the invention, the layer 14 may constitute a bulk dielectric layer 14a on top of an etch stop layer 14b, referring to FIG. 1c. The layer 14 can be a silicon-containing compound, such as silicon nitride or silicon oxide. Alternatively the layer 14 may be a chalcogenide, including phase change material.

Figure 1D:
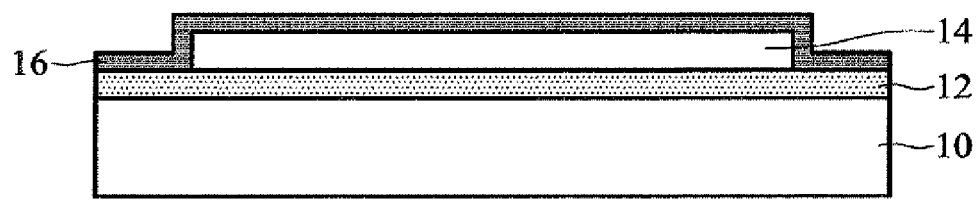

Next, referring to FIG. 1d, a first electrical contact 16 is conformally formed on the layer 14 to cover the ladder-like configuration 15, wherein the first electrical contact 16 is electrically connected to the bottom electrode 12 via surrounding top surface 13. Suitable material for the first electrical contact 16, for example, is Al, W, Mo, TiN, or TiW. Alternatively the first electrical contact 16 may be phase change material. The thickness of the first electrical contact 16 can be 10~50 nm.

Figure 1E:
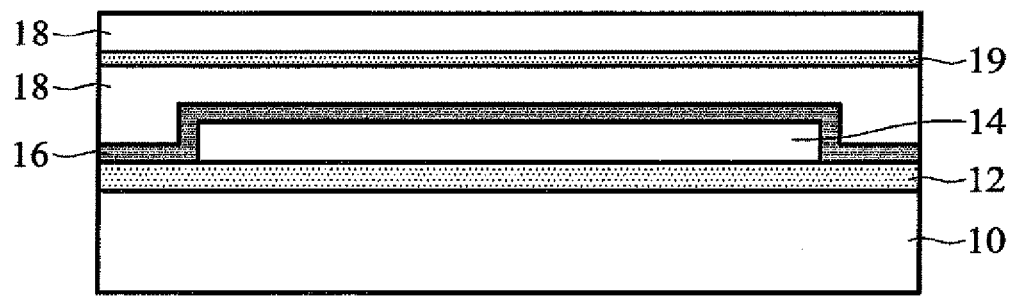

Next, referring to FIG. 1e, a first dielectric layer 18 is formed on the first electrical contact 16. The dielectric layer 18 can be a silicon-containing compound, such as silicon nitride or silicon oxide. The first dielectric layer 18 includes an etch stop layer 19 deposited therein.

Figure 1F:
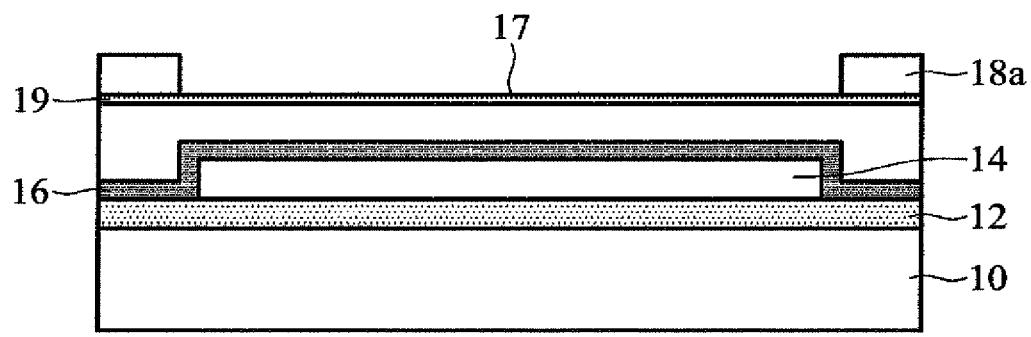

Next, referring to FIG. 1f, the dielectric layer 18 is etched to remain a dielectric layer 18a with a trench 17. The etch stop layer 19 helps to control the etch depth of the trench 17.

Figure 1G:
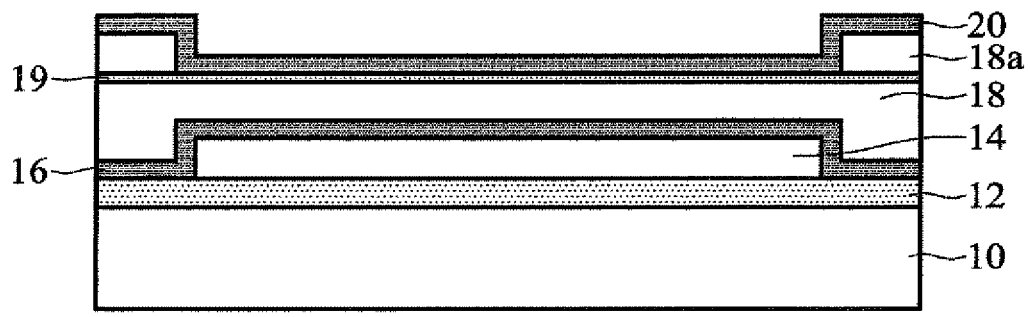

Next, referring to FIG. 1g, a second electrical contact 20 is conformally formed on the dielectric layer 18a to cover the side-walls and bottom of the trench 17. The thickness of the second electrical contact 20 can be 10~50 nm. It should be noted that the depth of the trench 17 is larger than the thickness of the second electrical contact 20.

Figure 1H:
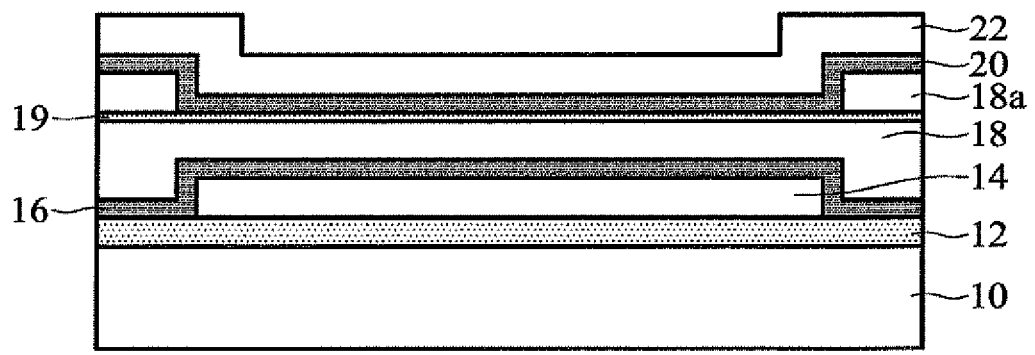

Next, referring to FIG. 1h, a non-metallic layer 22 is formed on and covers the second electrical contact 20. The non-metallic layer 22 includes silicon oxide, silicon nitride, or combinations thereof. Alternatively, the non-metallic layer 22 may be a chalcogenide, including phase change material.

Figure 1I:
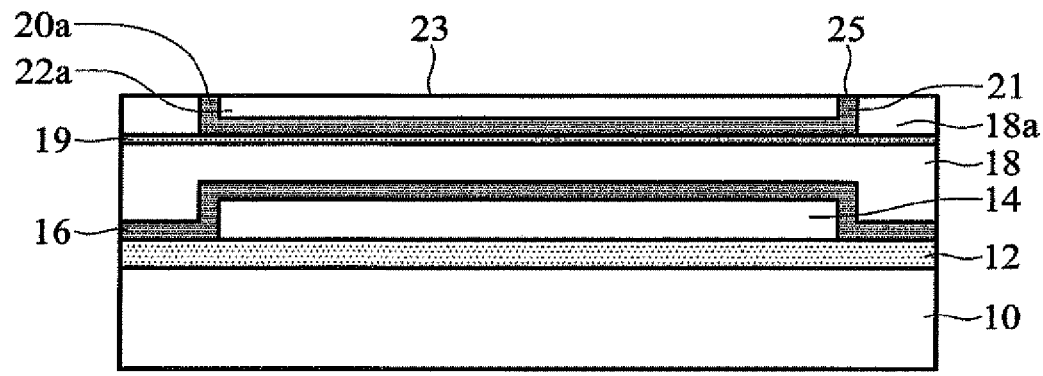

Next, referring to FIG. 1i, the non-metallic layer 22 and the second electrical conduct 20 are subjected to a planarization process such as chemical mechanical polishing with the dielectric layer 18a serving as an etching stop layer, exposing the top surface 25 of outstanding terminals 21 of the remaining second electrical contact 20a and the top surface 23 of the remaining layer 22a. Further, the planarization process results in coplanar top surfaces 25 and 23, respectively, of the outstanding terminals 21 and the remaining layer 22a.

Figure 1J:
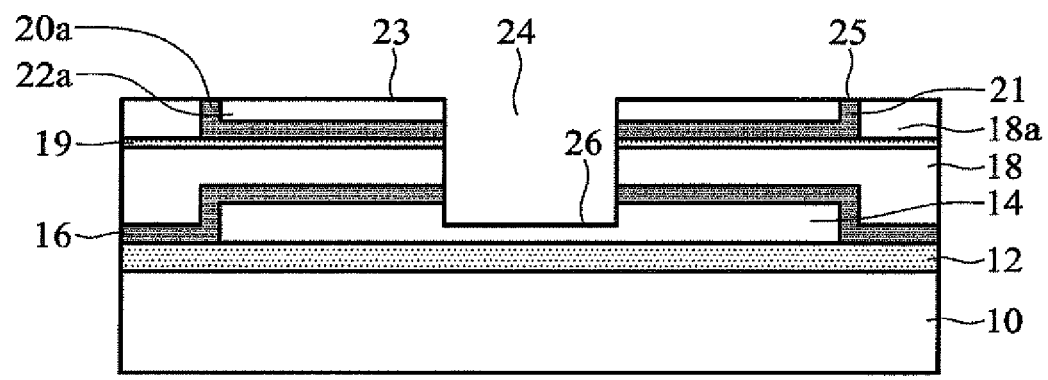

Next, referring to FIG. 1j, an opening 24 is formed to pass through the second electrical contact 20a, the remaining layer 22a, the first dielectric layer 18, the etch stop layer 19, the first electrical contact 16 and a part of the non-metallic layer 14, wherein the bottom 26 of the opening 24 is separated from the bottom electrode 12 by the non-metallic layer 14. If the non-metallic layer 14 contained an etch stop layer, that could help guarantee the separation.

Figure 1K:
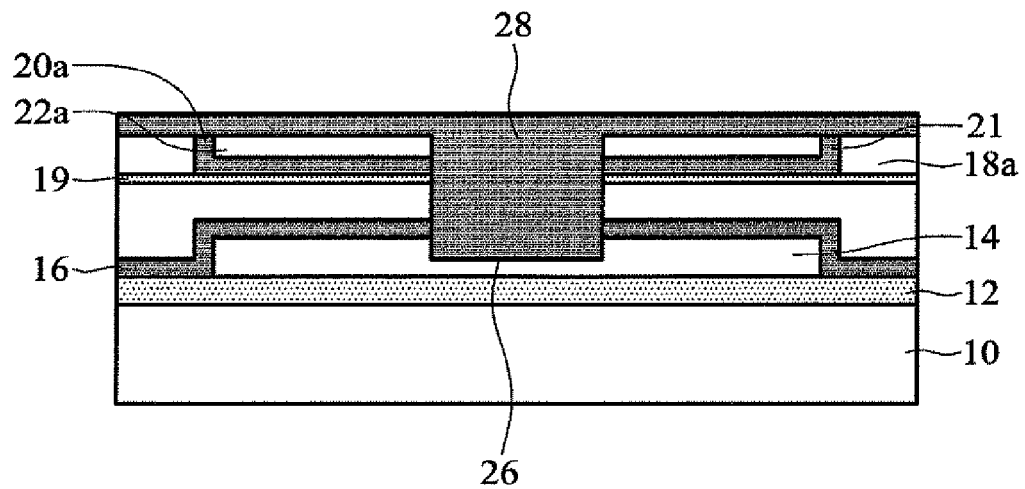

Next, referring to FIG. 1k, a phase change layer 28 is formed on the remaining layer 22a, the dielectric layer 18a, the remaining second electrical contact 20a, and filled in the opening 24. The phase change layer 28 include In, Ge, Sb, Te, Ga, Sn or combinations thereof, such as GeTe, GeSb, SbTe, GeSbTe or InGeSbTe.

Figure 1L:
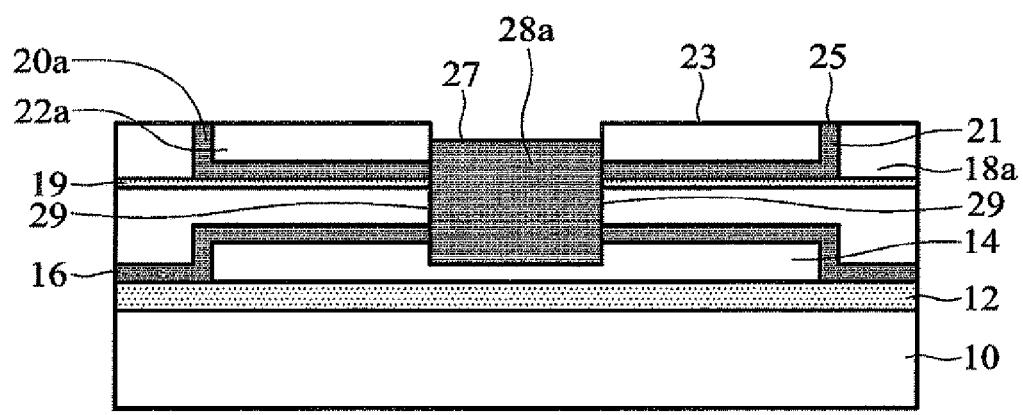

Next, referring to FIG. 1l, the phase change layer 28 is etched back to form a phase change material block 28a. It should be noted that the top surface 27 of the phase change material block 28a is lower than the top surface 23 of the remaining layer 22a. Further, the top surface 27 of the phase change material block 28a is also lower than the top surface 25 of the outstanding terminals 21. Moreover, the first and second electrical contacts 16 and 20a interface the phase-change material block 28a at the side-walls 29 of the phase-change material block 28a, wherein the dimension of the cross-section areas between the phase-change material block 28a and the first (second) electrical contacts 16 (20a) depends on the thickness of the first (second) electrical contacts 16 (20a).

Figure 1M:
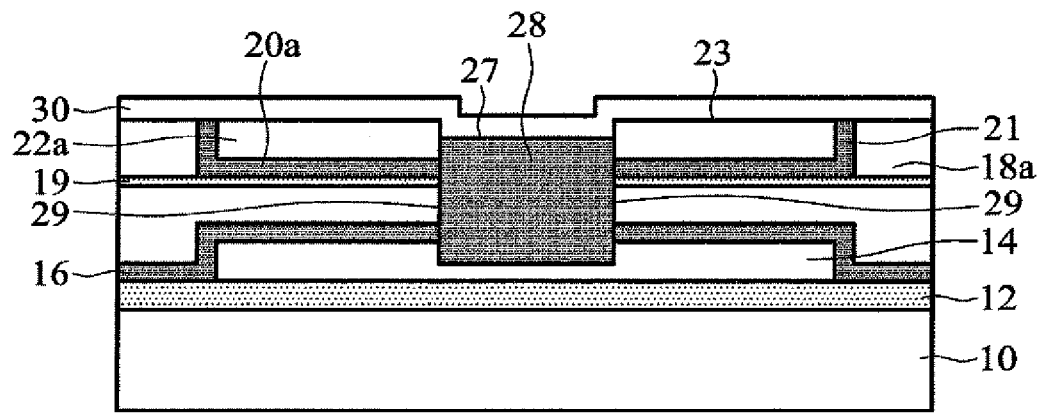

Next, referring to FIG. 1m, a second dielectric layer 30 is conformally formed on the layer 22a and the phase-change material block 28a. The dielectric layer 30 includes silicon oxide, silicon nitride, or combinations thereof. It should be noted that the total thickness of the dielectric layer 30 and the phase-change material block 28a is larger than the depth of the opening 24.

Figure 1N:
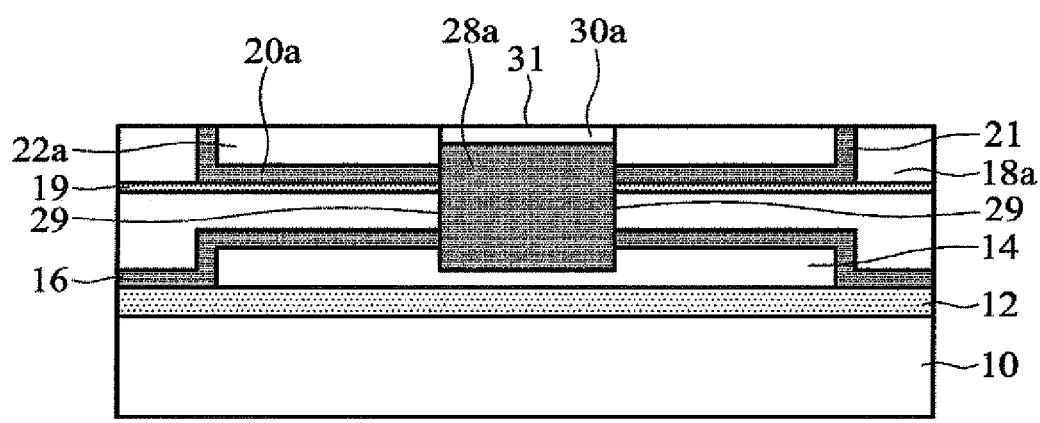

Next, referring to FIG. 1n, the dielectric layer 30 is subjected to a planarization process such as chemical mechanical polishing with the layer 22a serving as an etching stop layer, exposing the top surface 25 of outstanding terminals 21 of the remaining second electrical contact 20a and the top surface 31 of the remaining dielectric layer 30a. Further, the planarization process results in coplanar top surfaces 25 and 31, respectively, of the outstanding terminals 21 and remaining dielectric layer 30a.

Figure 1O:
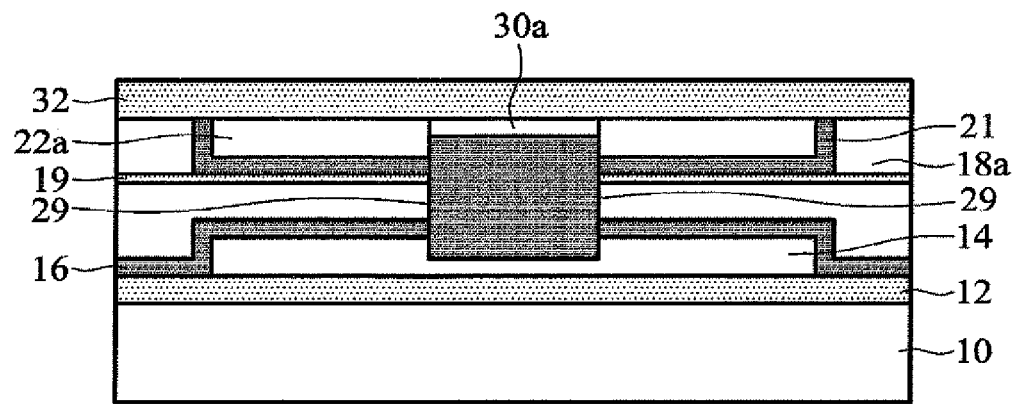

Finally, referring to FIG. 1o, the top electrode 32 is formed on the dielectric layer 30a and directly contacts the top surface 25 of the outstanding terminal 21 of the second electrical contact 20a. Suitable material for the top electrode 32, for example, is Al, W, Mo, Ti, TiN, TiAlN, TiW or TaN.

Figure 2:
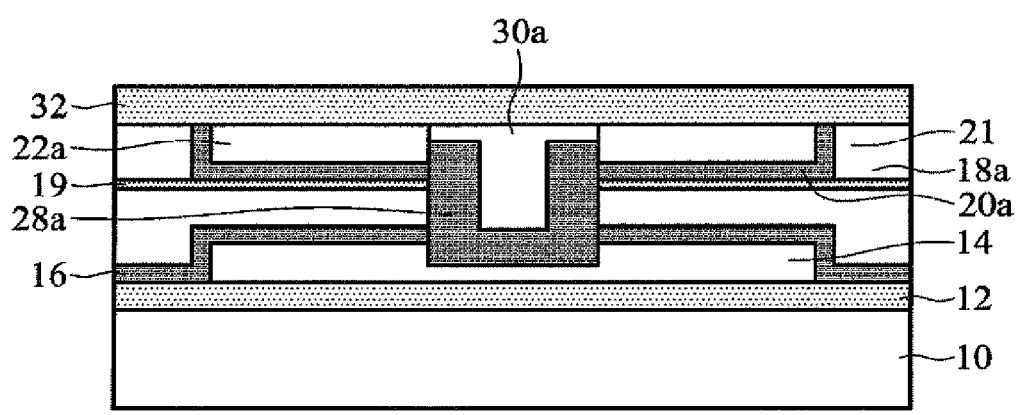
FIG. 2 is a cross section of a phase-change memory according to another embodiment of the invention.

According to another embodiment of the invention, the profile of the phase-change material block 28a can be square (referring to FIG. 1o), or other shapes (such as a U-shape as seen in FIG. 2). In still another embodiment (not shown), the first and second electrical contacts 16,20a are directly contacting the bottom and top electrodes 12,32, respectively.

By forming side-wall contacts to both the top and bottom electrodes of the phase-change memory cell, heating is confined at the side-walls of the block of phase-change material, which is also the location of greatest cooling. This allows for thermal uniformity to be improved compared to devices which are heated near the center of the phase-change material. Furthermore, the voltage required can be minimized by reducing the distance between the edge contacts. Also, the heating area is reduced, hence heating efficiency improved by reducing the side-wall contact thickness as well as by reducing the width of the phase-change material. The cell also has the capability to operate by means of controlling the partial coverage of the amorphous phase change material formed over the first and second electrical contacts. Thus, the electrical resistance is determined mainly by the resistivity of the crystalline phase change material between the contacts. This is important since the amorphous phase change material resistivity is more likely to drift over time than the crystalline state.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A method, comprising:
    forming a first electrical contact;
    forming a dielectric layer on the first electrical contact;
    forming a second electrical contact on the dielectric layer, wherein a first end of the second electrical contact comprises a terminal;
    forming an opening passing through the second electrical contact, the dielectric layer, and the first electrical contact;
    filling a phase-change material into at least part of the opening, wherein both the first electrical contact and a second end of the second electrical contact interface the phase-change material at one or more sidewalls of the phase-change material; and
    forming an electrode contacting the terminal.

2. The method of claim 1, further comprising forming a non-metallic layer on a bottom electrode, wherein the first electrical contact is electrically coupled to the bottom electrode, and wherein the phase-change material is separated from the bottom electrode by the non-metallic layer.

3. The method of claim 2, wherein the non-metallic layer and the bottom electrode create a ladder-like configuration, and wherein the method further comprises forming the first electrical contact to cover the ladder-like configuration.

4. The method of claim 2, wherein the non-metallic layer comprises a dielectric material.

5. The method of claim 2, wherein the non-metallic layer comprises a phase-change material.

6. The method of claim 1, further comprising forming a non-metallic layer on the second electrical contact, wherein the opening additionally passes through the non-metallic layer.

7. The method of claim 6, wherein said filling a phase-change material comprises:
    forming a phase-change layer on the non-metallic layer; and
    etching the phase-change layer, wherein a top surface of the phase-change material is lower than a top surface of the non-metallic layer in response to said etching.

8. The method of claim 6, further comprising planarizing both the non-metallic layer and the second electrical contact, wherein said planarizing comprises exposing a top surface of the terminal, and wherein the electrode contacts the top surface of the terminal.

9. The method of claim 6, wherein said forming an electrode comprises forming the electrode on the non-metallic layer.

10. The method of claim 1, further comprising etching the dielectric layer to form a trench, wherein said forming a second electrical contact comprises forming the second electrical contact in the trench.

11. The method of claim 1, further comprising filling a second dielectric layer into the opening, wherein a top surface of the dielectric layer and a top surface of the terminal are made coplanar in response to said filling a second dielectric layer.

12. The method of claim 11, wherein said forming an electrode comprises forming the electrode on the second dielectric layer.

13. The method of claim 1, further comprising planarizing the second electrical contact to expose a top surface of the terminal, wherein the electrode contacts the top surface of the terminal.

14. The method of claim 13, wherein said planarizing comprises planarizing the second electrical contact by chemical mechanical polishing.

15. The method of claim 1, further comprising depositing an etch stop layer in the dielectric layer prior to said forming a second electrical contact.

16. The method of claim 1, wherein the dielectric layer electrically isolates the first electrical contact from the second electrical contact.

17. The method of claim 1, wherein the phase-change material comprises indium, germanium, antimony, tellurium, gallium, or tin.

18. The method of claim 1, wherein one or both of the first electrical contact and the second electrical contact comprise aluminum, tungsten, molybdenum, titanium, titanium-nitrogen, titanium-aluminum-nitrogen, titanium-tungsten, tantalum-nitrogen, or a phase-change material.

19. The method of claim 1, wherein the electrode comprises aluminum, tungsten, molybdenum, titanium, titanium-nitrogen, titanium-aluminum-nitrogen, titanium-tungsten, or tantalum-nitrogen.

20. The method of claim 1, wherein the opening is located below the electrode.

* * * * *